United States Patent
Lee et al.

(10) Patent No.: US 8,669,127 B2
(45) Date of Patent: Mar. 11, 2014

(54) METHOD FOR MANUFACTURING AN ORGANIC LIGHT EMITTING DIODE DISPLAY

(71) Applicants: Yul-Kyu Lee, Yongin (KR); Sun Park, Yongin (KR); Chun-Gi You, Yongin (KR); Jong-Hyun Park, Yongin (KR)

(72) Inventors: Yul-Kyu Lee, Yongin (KR); Sun Park, Yongin (KR); Chun-Gi You, Yongin (KR); Jong-Hyun Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/860,339

(22) Filed: Apr. 10, 2013

(65) Prior Publication Data

US 2013/0217165 A1 Aug. 22, 2013

Related U.S. Application Data

(62) Division of application No. 13/067,025, filed on May 3, 2011, now Pat. No. 8,436,357.

(30) Foreign Application Priority Data

Sep. 28, 2010 (KR) .................... 10-2010-0093837

(51) Int. Cl.
*H01L 21/00* (2006.01)
(52) U.S. Cl.
USPC ........... 438/34; 438/82; 257/59; 257/E51.018

(58) Field of Classification Search
USPC ................. 438/34, 82; 257/59, E51.018
See application file for complete search history.

(56) References Cited

U.S. PATENT DOCUMENTS

2010/0270541 A1 10/2010 Liu et al.

FOREIGN PATENT DOCUMENTS

| KR | 10-2006-0073370 A | 6/2006 |
| KR | 10-2007-0115355 A | 12/2007 |
| KR | 10-2010-0013799 A | 2/2010 |

*Primary Examiner* — Timor Karimy
(74) *Attorney, Agent, or Firm* — Lee & Morse, P.C.

(57) ABSTRACT

Making an OLED display, includes forming a first storage plate and a gate insulating layer covering the first storage plate on a substrate; sequentially forming a second storage plate covering the first storage plate and a capacitor intermediate on the gate insulating layer; forming a first doping region by injecting an impurity to a part that is not covered by the capacitor intermediate in the first storage plate; forming an interlayer insulating layer having a capacitor opening exposing the capacitor intermediate, and a plurality of erosion preventing layers on an edge of the capacitor intermediate toward the first doping region in the capacitor opening; removing the capacitor intermediate including the erosion preventing layer and a lower region of the erosion preventing layer, and injecting an impurity in the first storage plate through the second storage plate to form a second doping region contacting the first doping region.

8 Claims, 16 Drawing Sheets

METHOD FOR MANUFACTURING AN ORGANIC LIGHT EMITTING DIODE DISPLAY

CROSS REFERENCE TO RELATED APPLICATION

This is a divisional application based on pending application Ser. No. 13/067,025, filed May 3, 2011, the entire contents of which is hereby incorporated by reference.

BACKGROUND

1. Field

Embodiments relate to an organic light emitting diode (OLED) display and a manufacturing method, thereof. More particularly, the embodiments relate to a capacitor.

2. Description of the Related Art

An organic light emitting diode (OLED) display includes a plurality of pixels, each of which has a driving circuit and an organic light emitting element. The driving circuit includes at least two thin film transistors. The driving circuit includes a switching thin film transistor, a driving thin film transistor, and at least one capacitor. The organic light emitting element includes a pixel electrode, an organic emission layer, and a common electrode. One of a pixel electrode and a common electrode is a hole injection electrode and the other is an electron injection electrode.

The capacitor includes a first storage plate and a second storage plate with a gate insulating layer therebetween. The first storage plate is made of polysilicon.

The above disclosed information in the Background section is only for understanding the background of the described technology. Therefore, it may contain information that does not form the prior art already known in this country to a person of ordinary skill in the art.

SUMMARY

It is a feature of an embodiment to provide an organic light emitting diode display for preventing signal interception of a first storage plate by minimizing generation of the non-doping region.

It is another feature of an embodiment of an embodiment to provide a manufacturing method of an organic light emitting diode display for preventing signal interception of a first storage plate by minimizing generation of the non-doping region.

At least one of the above and other features and advantages may be realized by providing an organic light emitting diode display, including: a substrate; an organic light emitting element formed on the substrate; a plurality of thin film transistors for driving the organic light emitting element; and a capacitor including a first storage plate and a second storage plate on the first storage plate with a gate insulating layer therebetween, the capacitor being connected to the thin film transistor.

The first storage plate includes: a first doping region; a plurality of non-doping regions contacting the first doping region; and a second doping region contacting the first doping region through gaps between the non-doping regions.

The first storage plate is formed in a line pattern, and the non-doping regions are separately positioned from each other in the width direction of the first storage plate.

The first doping region and the second doping region are connected in the length direction of the first storage plate.

The second storage plate is positioned in the non-doping regions and the second doping region.

The organic light emitting diode display further includes an interlayer insulating layer including a storage plate opening for exposing part of the second storage plate on the second storage plate, and the storage plate opening is formed to be wider than the second storage plate.

The thin film transistor includes a switching thin film transistor and a drive thin film transistor, and the drive thin film transistor includes a drive gate electrode electrically connected to the first doping region.

The interlayer insulating layer forms a contact hole in the second storage plate, and the organic light emitting diode display further includes a common voltage line formed in the interlayer insulating layer and electrically connected to the second storage plate through the contact hole.

At least one of the above and other features and advantages may also be realized by providing a method for manufacturing an organic light emitting diode display, including: forming a first storage plate of a polysilicon layer and a gate insulating layer for covering the first storage plate on a substrate; sequentially forming a second storage plate for covering the first storage plate and a capacitor intermediate on the gate insulating layer; forming a first doping region by injecting an impurity to a part that is not covered by the capacitor intermediate in the first storage plate; forming an interlayer insulating layer having a capacitor opening for exposing the capacitor intermediate, the interlayer insulating layer having a plurality of erosion preventing layers on an edge of the capacitor intermediate toward the first doping region in the capacitor opening; and removing the capacitor intermediate including the erosion preventing layer and a lower region of the erosion preventing layer, and injecting an impurity in the first storage plate through the second storage plate to form a second doping region contacting the first doping region.

The first storage plate is formed in a line pattern, and the second storage plate and the capacitor intermediate are positioned in a region other than an end of the first storage plate.

The first doping region is positioned on the end of the first storage plate, and the second doping region extends to the first doping region in the length direction of the first storage plate.

The second storage plate is formed to be a transparent conductive layer, and the capacitor intermediate is formed with triple layers of the first metal layer/the second metal layer/the first metal layer.

The method further includes forming the erosion preventing layer and forming and patterning a data metal layer on the substrate, and the erosion preventing layer and the capacitor intermediate are simultaneously eliminated when the data metal layer is patterned.

The data metal layer is formed with the same material as the capacitor intermediate.

The capacitor opening is formed to be wider than the capacitor intermediate, and part of the edge of the capacitor intermediate that is not covered with the erosion preventing layer remains when the capacitor intermediate is removed.

The second doping region contacts the first doping region through a gap between the capacitor intermediates in the first storage plate.

DETAILED DESCRIPTION

Korean Patent Application No. 10-2010-0093837, filed on Sep. 28, 2010, in the Korean Intellectual Property Office, and entitled: "Organic Light Emitting Diode Display and Manufacturing Method Thereof," is incorporate by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be through and complete, and will fully convey the scope of the inventive concept to those skilled in the art.

It will be understood that when an element such as a layer, film, region, or substrate is referred to as being "on" another element, it can be directly on the other element or intervening elements may also be present.

FIGS. 1 to FIG. 14 show processing diagrams of a method for manufacturing an organic light emitting diode (OLED) display according to an exemplary embodiment.

Figure 1:
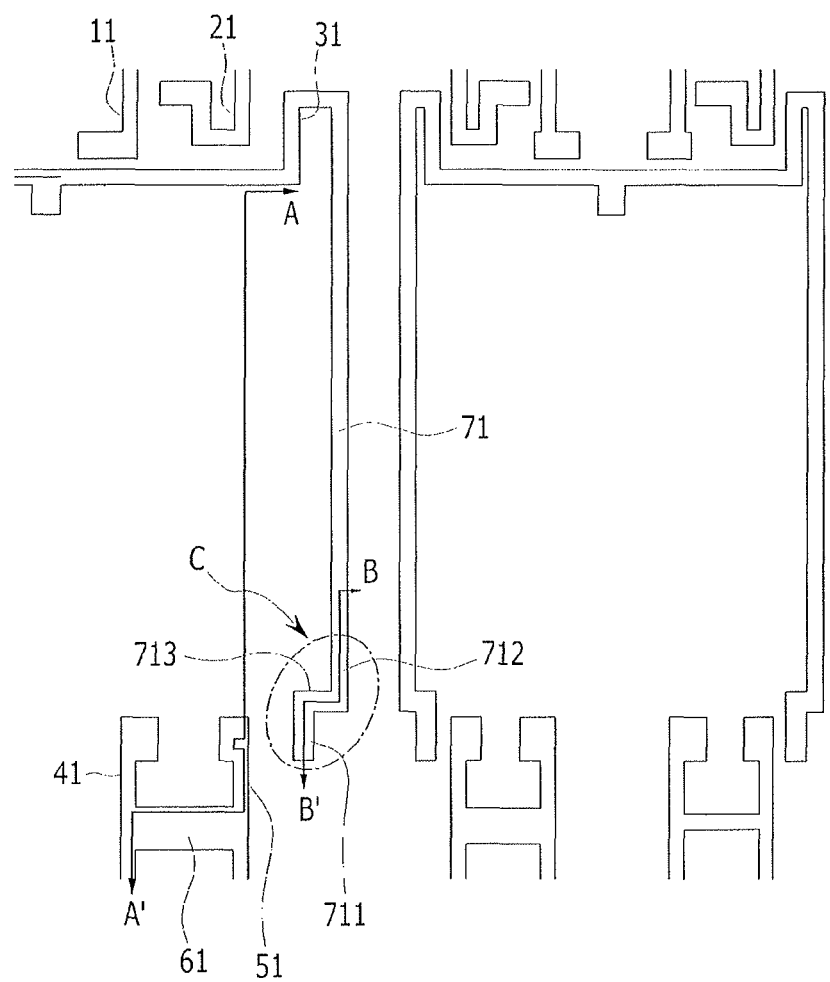
FIG. 1 shows a layout view of a first stage of manufacturing an organic light emitting diode (OLED) display according to an exemplary embodiment.
Figure 2:
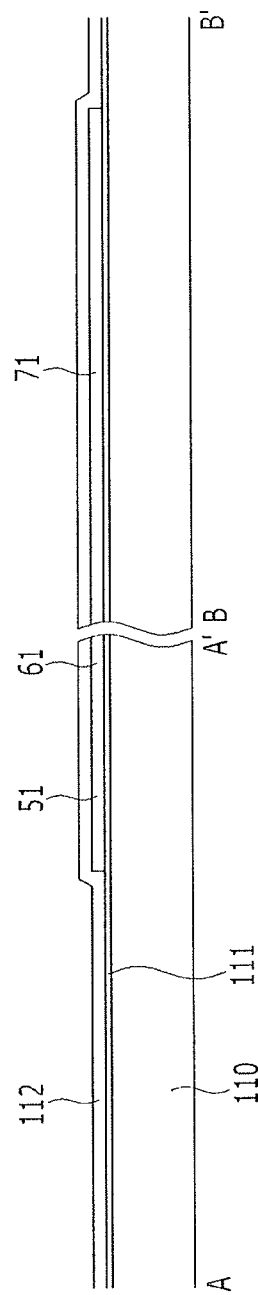
FIG. 2 shows a cross-sectional view with respect to lines A-A' and B-B' of FIG. 1.

FIG. 1 shows a layout view of a first stage of manufacturing an organic light emitting diode (OLED) display according to an exemplary embodiment, and FIG. 2 shows a cross-sectional view with respect to lines A-A' and B-B' of FIG. 1.

Referring to FIGS. 1-2, a buffer layer 111 is formed on a substrate 110. The substrate 110 is made of a transparent insulation substrate such as glass, quartz, or plastic. The buffer layer 111 can be formed with a single layer of SiNx or accumulated layers of SiNx or SiO2, and is deposited on the substrate 110 through the PECVD method.

A semiconductor layer is formed in the buffer layer 111. The semiconductor layer is formed with a polysilicon layer. The polysilicon layer is formed by forming an amorphous silicon layer and crystallizing the same. Many known methods are applicable to the crystallization method. For example, the amorphous silicon layer can be crystallized using heat, laser beams, Joule heat, an electric field, or a catalyst metal.

The semiconductor layer is patterned by using a first pattern mask through photolithography. First to fifth switching semiconductor layers 11, 21, 31, 41, and 51, a drive semiconductor layer 61, and a first storage plate 71 are simultaneously formed. A gate insulating layer 112 is formed on the substrate 110 to cover the first to fifth switching semiconductor layers 11, 21, 31, 41, and 51, the drive semiconductor layer 61, and the first storage plate 71. The gate insulating layer 112 can be formed with accumulated layers of SiNx and TEOS.

The first storage plate 71 is connected to a third switching semiconductor layer 31. The first storage plate 71 is formed in a line pattern in one direction (vertical direction with reference to FIG. 1) of the substrate 110 from the left or right of the pixel for each pixel. The first storage plate 71 can be formed with an end that is bent at least once. FIG. 1 exemplifies the case in which the end of the first storage plate 71 is bent twice (refer to the circle C indicated by the arrow), so the first storage plate 71 includes first and second vertical units 711 and 712 and a horizontal unit 713. The first storage plate 71 is not restricted to the example shown.

Figure 3:
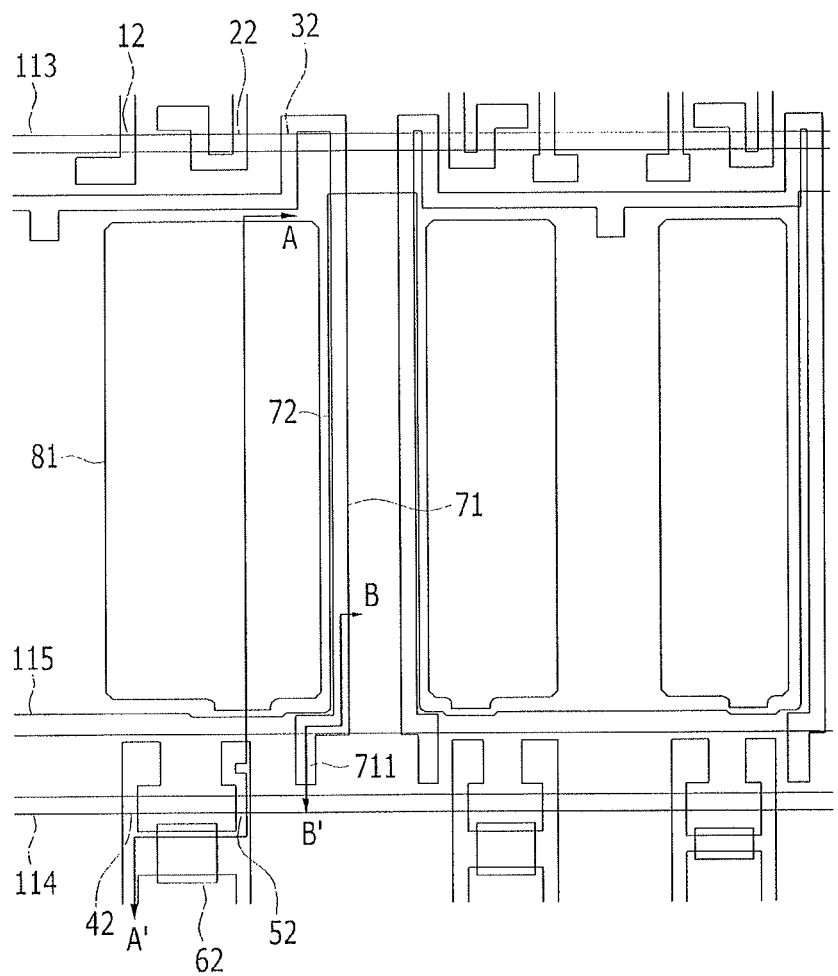
FIG. 3 shows a layout view of a second stage of manufacturing an organic light emitting diode (OLED) display according to an exemplary embodiment.
Figure 4:
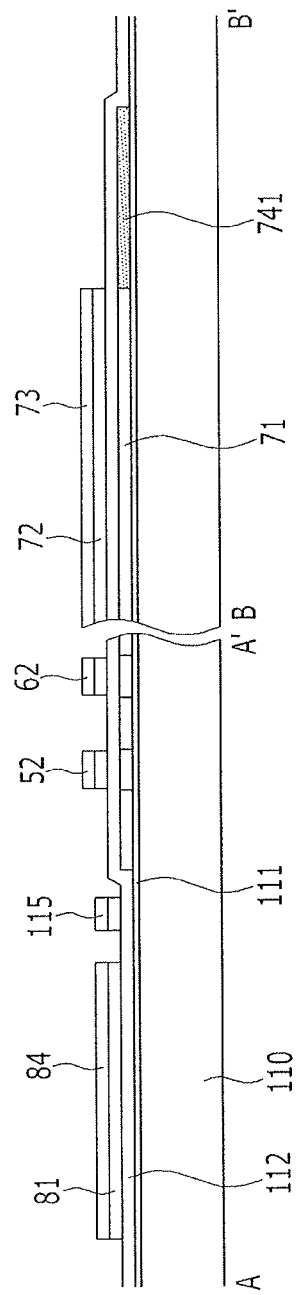
FIG. 4 shows a cross-sectional view with respect to lines A-A' and B-B' of FIG. 3.

FIG. 3 shows a layout view of a second stage of manufacturing an organic light emitting diode (OLED) display according to an exemplary embodiment. FIG. 4 shows a cross-sectional view with respect to lines A-A' and B-B' of FIG. 3.

Referring to FIGS. 3-4, a pixel electrode layer and a gate metal layer are sequentially formed on the gate insulating layer 112. The pixel electrode layer is formed to be a transparent conductive layer such as ITO or IZO. The gate metal layer can be formed with multilayers that are generated by accumulating a first metal layer and a second metal layer. The first metal layer may include one of molybdenum and a molybdenum alloy. The second metal layer may include one of copper, a copper alloy, aluminum, and an aluminum alloy. The gate metal layer can be formed with three multilayers of the first metal layer/the second metal layer/the first metal layer (e.g., molybdenum/aluminum/molybdenum).

A second pattern mask is used to pattern the gate metal layer and the pixel electrode layer through the photolithography process. A gate line 113 including first to third switching gate electrodes 12, 22, and 32, a gate control line 114 including fourth and fifth switching gate electrodes 42 and 52, a gate driving voltage line 115 including a second storage plate 72, a drive gate electrode 62, and a pixel electrode 81 are simultaneously formed.

The second storage plate 72 and the pixel electrode 81 are formed to be a pixel electrode layer. The second storage plate 72 is overlapped on the first storage plate 71. A capacitor intermediate 73 made of a gate metal layer is positioned on the second storage plate 72. A pixel electrode intermediate 84 made of a gate metal layer is formed on the pixel electrode 81. Part of the capacitor intermediate 73 and part of the pixel electrode intermediate 84 are eliminated in the next process.

The second storage plate 72 is overlapped on a part other than the end of the first storage plate 71. FIG. 1 exemplifies the case in which the second storage plate 72 covers the part other than the first vertical unit 711 of the first storage plate

71. FIG. 1 exemplifies the case in which one second storage plate 72 covers the first storage plate 71 of two neighboring pixels. However, the second storage plate 72 is not restricted thereto.

The first to fifth switching semiconductor layers 11, 21, 31, 41, and 51 and the drive semiconductor layer 61 are divided into channel regions, source regions, and drain regions by doping an impurity to the first to fifth switching semiconductor layers 11, 21, 31, 41, and 51 and the drive semiconductor layer 61. The channel region is an intrinsic semiconductor to which no impurity is doped. The source region and the drain region are impurity doped impurity semiconductors. The first to fifth switching gate electrodes 12, 22, 32, 42, and 52 and the drive gate electrode 62 prevent the impurity from being doped into the channel region when the impurity is doped.

While doping the impurity, i.e. the first vertical unit 711, the impurity is doped to the end of the first storage plate 71 that is not covered by the second storage plate 72 and the capacitor intermediate 73. The first vertical unit 711 becomes the first doping region formed with an impurity semiconductor 741 (refer to FIG. 4). The first storage plate 71 forms the first doping region 741 at the end in the second pattern mask process.

Figure 5:
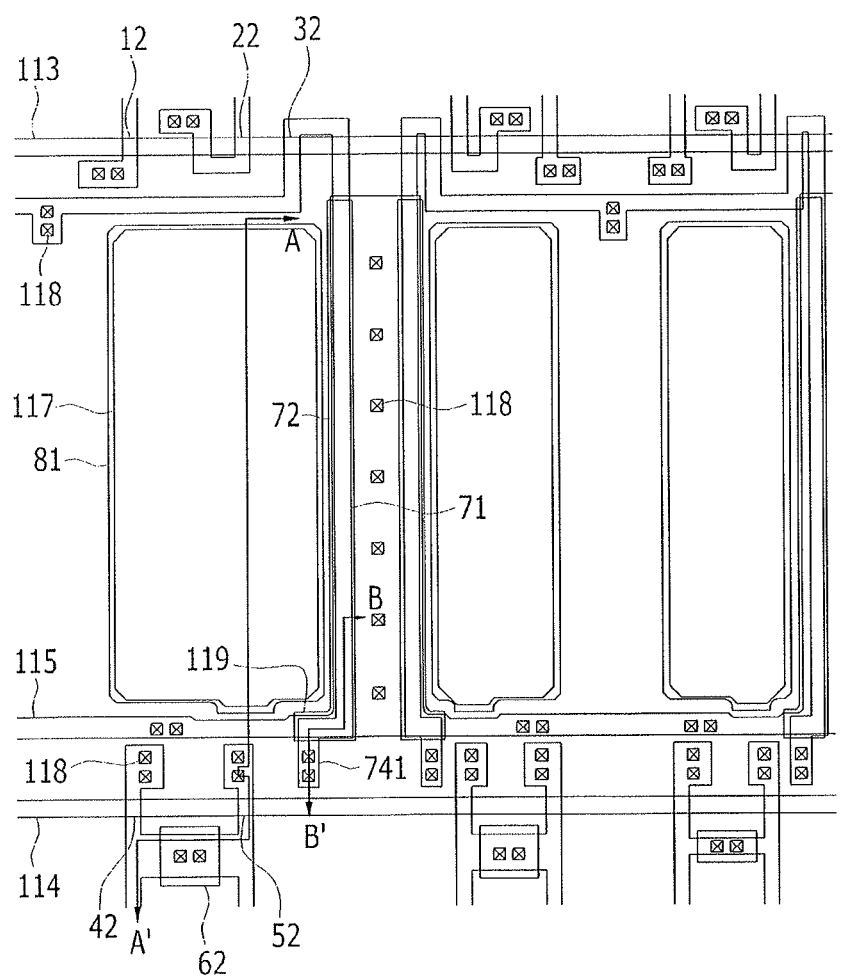
FIG. 5 shows a layout view of a third stage of manufacturing an organic light emitting diode (OLED) display according to an exemplary embodiment.
Figure 6:
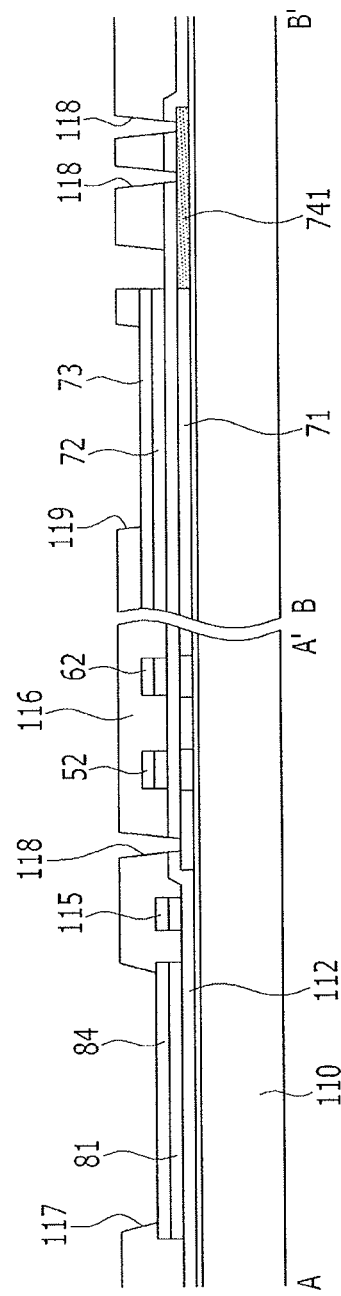
FIG. 6 shows a cross-sectional view with respect to lines A-A' and B-B' of FIG. 5.

FIG. 5 shows a layout view of a third stage of manufacturing an organic light emitting diode (OLED) display according to an exemplary embodiment, and FIG. 6 shows a cross-sectional view with respect to lines A-A' and B-B' of FIG. 5.

Referring to FIGS. 5-6, an interlayer insulating layer 116 is formed over the substrate 110 to cover the members formed in the previous stage. The interlayer insulating layer 116 is formed with an organic layer or inorganic layer. A pixel opening 117, a plurality of contact holes 118, and a storage plate opening 119 are formed by patterning the interlayer insulating layer 116 through the photolithography process using a third pattern mask.

The contact hole 118 of the interlayer insulating layer 116 reveals a drain region of the fifth switching semiconductor layer 51 and the first doping region 741 of the first storage plate 71. In this instance, the contact hole 118 is formed when the interlayer insulating layer 116 and the gate insulating layer 112 are removed. The pixel opening 117 reveals most of the pixel electrode intermediate 84. The storage plate opening 119 reveals most of the region overlapped on the first storage plate 71 from among the capacitor intermediate 73.

Figure 7:
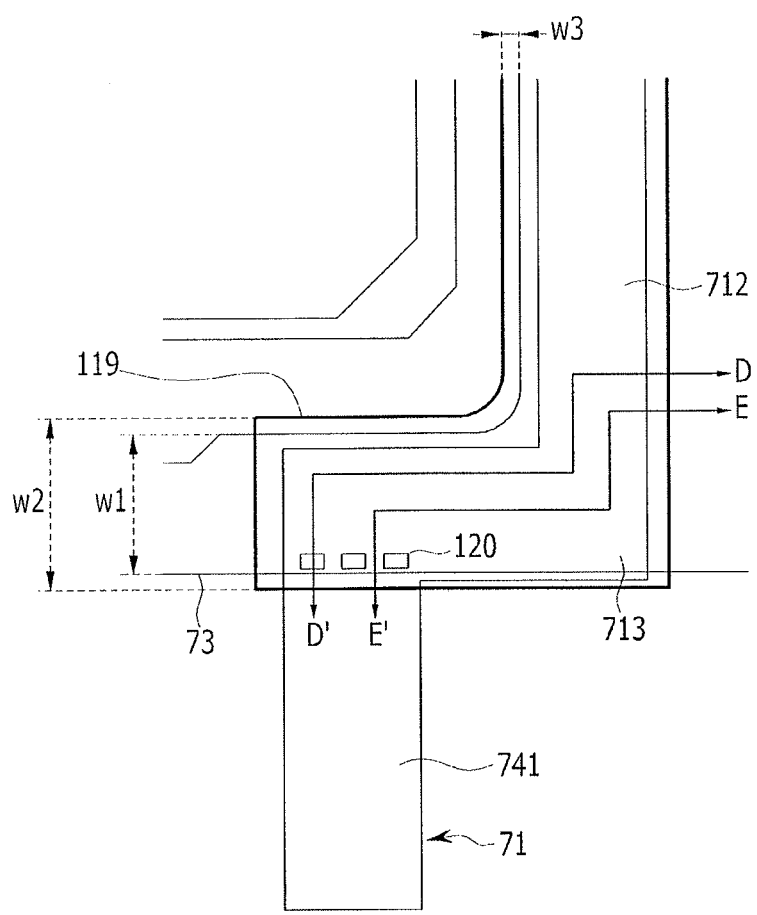
FIG. 7 shows a partial enlarged view of an organic light emitting diode (OLED) display shown in FIG. 5.
Figure 8:
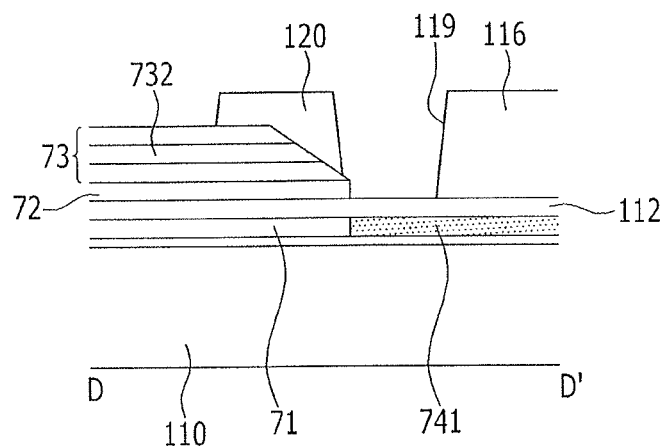
FIG. 8 shows a cross-sectional view with respect to a line D-D' of FIG. 7.
Figure 9:
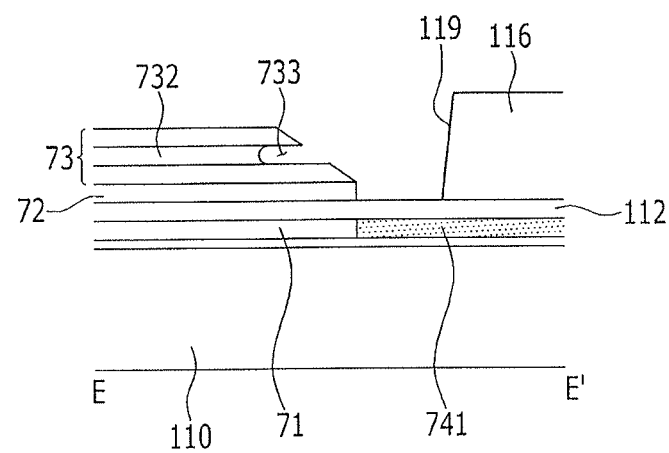
FIG. 9 shows a cross-sectional view with respect to a line E-E' of FIG. 7.

FIG. 7 shows a partial enlarged view of an organic light emitting diode (OLED) display shown in FIG. 5. FIG. 8 shows a cross-sectional view with respect to a line D-D' of FIG. 7. FIG. 9 shows a cross-sectional view with respect to a line E-E' of FIG. 7.

Referring to FIGS. 7-9, the storage plate opening 119 is positioned on the horizontal unit 713 of the first storage plate 71 and the second vertical unit 712 to expose the capacitor intermediate 73 provided below. The storage plate opening 119 is formed to be on the horizontal unit 713 of the first storage plate 71. The storage plate opening 119 is wider than the capacitor intermediate 73 in the width direction of the horizontal unit 713 (vertical direction with reference to FIG. 7). In FIG. 7, the width of the capacitor intermediate 73 measured in the width direction of the horizontal unit 713 is indicated as w1, and the width of the storage plate opening 119 measured in the same direction is given to be w2.

The storage plate opening 119 is formed to be wider than the capacitor intermediate 73 on the left side of the second vertical unit 712 of the first storage plate 71. The storage plate opening 119 is positioned to be separated from the capacitor intermediate 73 by a predetermined distance (refer to w3 of FIG. 7). When the interlayer insulating layer 116 is patterned to form the storage plate opening 119, the storage plate opening 119 is formed to be wider than the capacitor intermediate 73.

A plurality of erosion preventing layers 120 are formed by controlling the interlayer insulating layer 116 to remain at the edge of the capacitor intermediate 73 toward the first doping region 741.

The erosion preventing layers 120 are provided with a gap therebetween on the edge of the capacitor intermediate 73 along the width direction of the first doping region 741 (horizontal direction with reference to FIG. 7). The erosion preventing layers 120 can be formed to be quadrangular, circular, or polygonal, and FIG. 7 exemplifies the quadrangular erosion preventing layers 120. FIG. 7 shows three erosion preventing layers 120, and the number of erosion preventing layers 120 is variable.

When the erosion preventing layers 120 are positioned over the edge of the capacitor intermediate 73, part of the edge of the capacitor intermediate 73 is covered by the erosion preventing layer 120 (refer to FIG. 8), and another edge is exposed to the storage plate opening 119 (refer to FIG. 9). In this instance of the second manufacturing stage, the pixel electrode layer and the gate electrode layer may be misaligned to expose part of the second storage plate 72. Thus, a plurality of erosion preventing layers 120 can be formed over the second storage plate 72 and the capacitor intermediate 73.

Part of the edge of the capacitor intermediate 73 exposed to the storage plate opening 119 can be eroded by an etchant (e.g., hydrofluoric acid) of the interlayer insulating layer 116. For example, when a second metal layer 732 of the capacitor intermediate 73 is aluminum, the second metal layer 732 is eroded because of hydrofluoric acid to form a recess portion 733. The second metal layer 732 is not eroded at the edge of the capacitor intermediate 73 covered with the erosion preventing layer 120.

Figure 10:
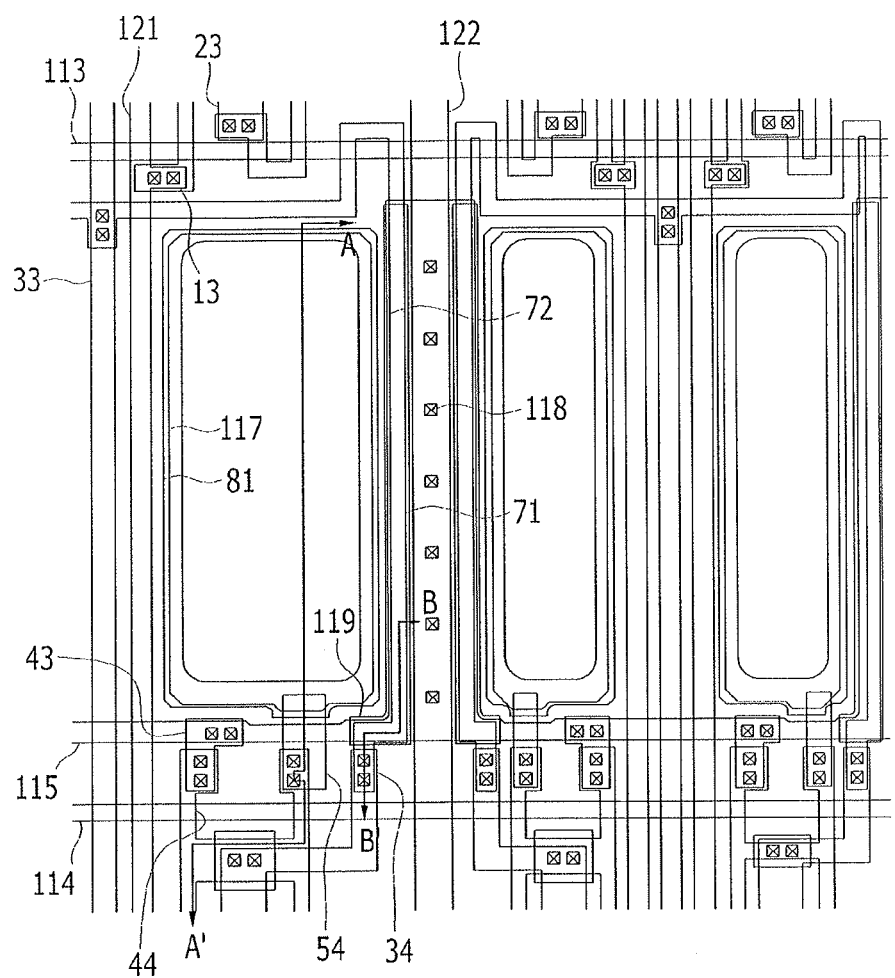
FIG. 10 shows a layout view of a fourth stage of manufacturing an organic light emitting diode (OLED) display according to an exemplary embodiment.
Figure 11:
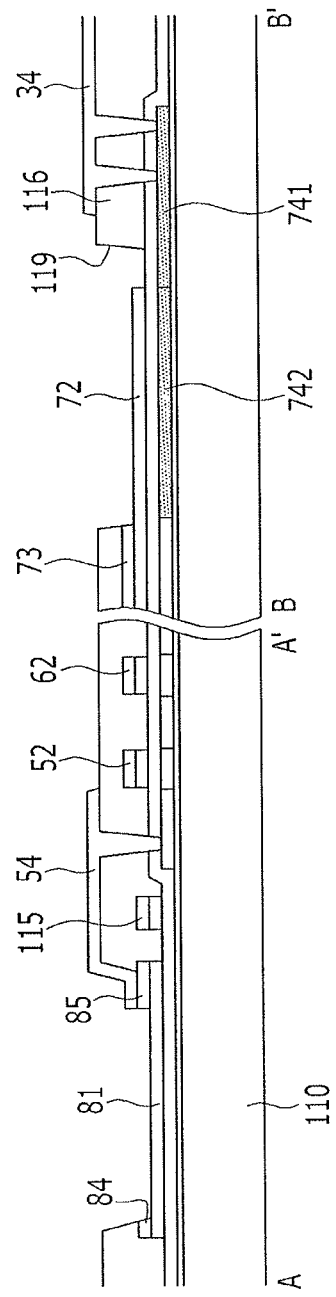
FIG. 11 shows a cross-sectional view with respect to lines A-A' and B-B' of FIG. 10.

FIG. 10 shows a layout view of a fourth stage of manufacturing an organic light emitting diode (OLED) display according to an exemplary embodiment. FIG. 11 shows a cross-sectional view with respect to lines A-A' and B-B' of FIG. 10.

Referring to FIGS. 10-11, a data metal layer is formed over the substrate 110 to cover the members that are formed in the previous stage. The data metal layer can be formed with multilayers generated by accumulating a first and a second metal layer. A first metal layer may include one of molybdenum and a molybdenum alloy. A second metal layer may include one of copper, a copper alloy, aluminum, and an aluminum alloy. The data metal layer can be formed with triple layers of the first metal layer/the second metal layer/the first metal layer (e.g., molybdenum/aluminum/molybdenum).

A fourth pattern mask is used to pattern the data metal layer through the photolithography process. A data line 121 including a first switching source electrode 13, a second switching source electrode 23, a third switching source electrode 33, a third switching drain electrode 34, a fourth switching source electrode 43, a fourth switching drain electrode 44, a fifth switching drain electrode 54, a common voltage line 122, and other wires are formed.

The pixel electrode intermediate 84 and the data metal layer are formed with the same material. Therefore, the pixel electrode intermediate 84 is removed when the data metal layer is etched to expose the pixel electrode 81. During this process, the pixel electrode intermediate 84 is controlled to remain to form a contact portion 85 to contact the fifth switching drain electrode 54 on the pixel electrode 81. The aperture ratio can be increased since the pixel opening 117 can be formed to be wider.

The capacitor intermediate 73 and the data metal layer are formed with the same material. Therefore, the capacitor intermediate 73 is removed when the data metal layer is etched, exposing the second storage plate 72. The impurity is doped to the first storage plate 71 through the exposed second storage plate 72 to form a second doping region 742 on the first storage plate 71.

Figure 12:
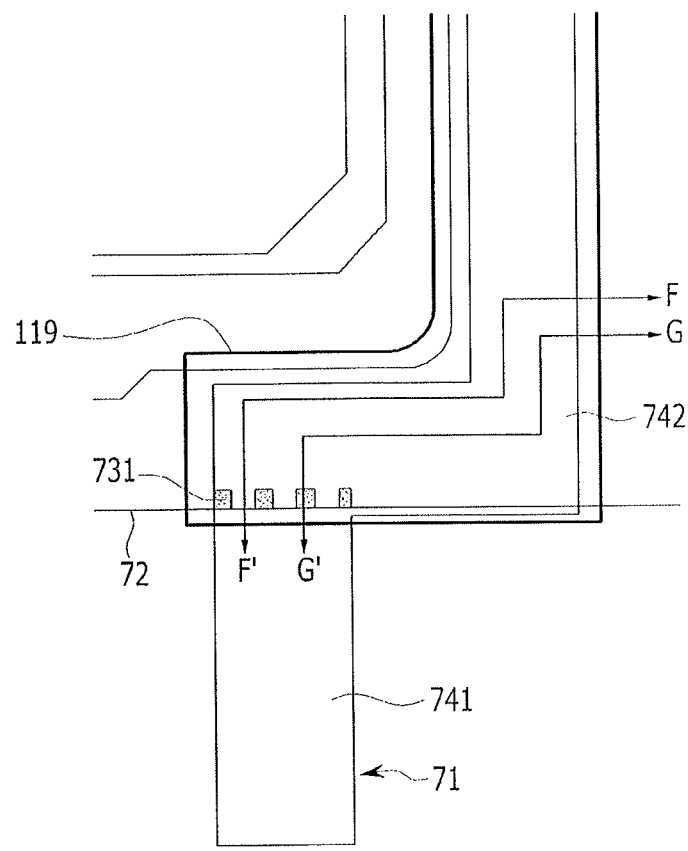
FIG. 12 shows a partial enlarged view of an organic light emitting diode (OLED) display shown in FIG. 10.
Figure 13:
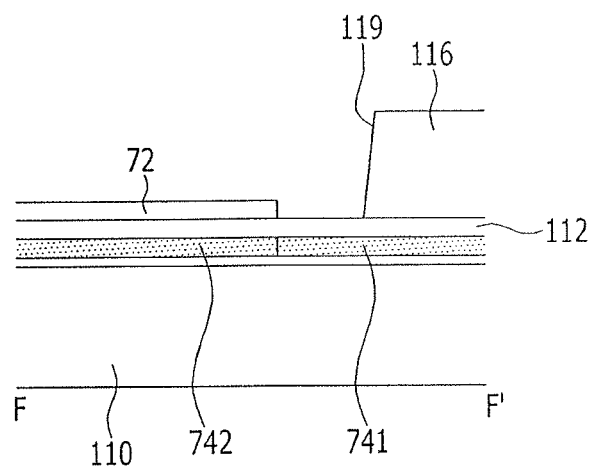
FIG. 13 shows a cross-sectional view with respect to a line F-F' of FIG. 12.
Figure 14:
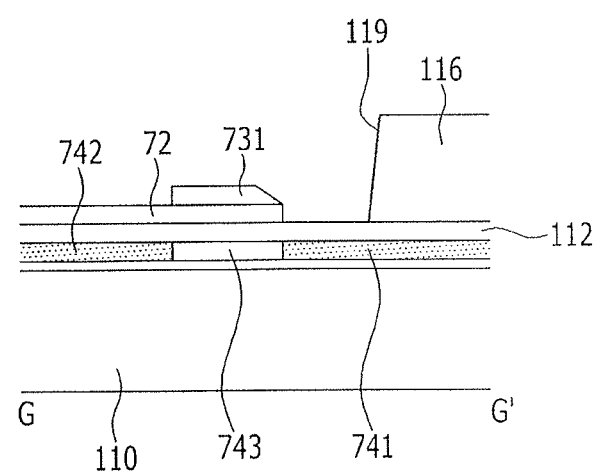
FIG. 14 shows a cross-sectional view with respect to a line G-G' of FIG. 12.

FIG. 12 shows a partial enlarged view of an organic light emitting diode (OLED) display shown in FIG. 10. FIG. 13 shows a cross-sectional view with respect to a line F-F' of FIG. 12. FIG. 14 shows a cross-sectional view with respect to a line G-G' of FIG. 12.

Referring to FIGS. 12-14, the capacitor intermediate 73 is removed in the first region in the capacitor intermediate 73 in the previous stage. Referring to FIG. 8, the first region is covered with the erosion preventing layer 120. Therefore, when the data metal layer is etched, no capacitor intermediate 73 remains on the second storage plate 72 (refer to FIG. 13). Thus, the second doping region 742 formed on the first storage plate 71 after the impurity is doped contacts the first doping region 741.

A plurality of erosion preventing layers 120 are separately positioned. The separate positioning of the erosion preventing layers 120 prevents formation of a single erosion preventing layer 120. Therefore, the etchant of the data metal layer easily goes between the erosion preventing layers 120 to efficiently suppress maintaining of the capacitor intermediate 73 in the first region.

The photoresist for patterning the data metal layer remains in the recess portion 733 (refer to FIG. 9) of the second metal layer 732. The recess portion 733 of the second metal layer 732 in the second region that is not covered with the erosion preventing layer 120 of the capacitor intermediate 73 in the previous stage. Thus, the photoresist for patterning the data metal layer can interfere with etching of the first metal layer on the lower part, thereof. Part of the first metal layer 731 remains after the data metal layer is patterned. The other part of the first metal layer 731 blocks doping of the impurity while the impurity is doped (refer to FIG. 14). Therefore, a non-doping region 743 may be generated between the first doping region 741 and the second doping region 742 below the first metal layer 731.

Figure 15:
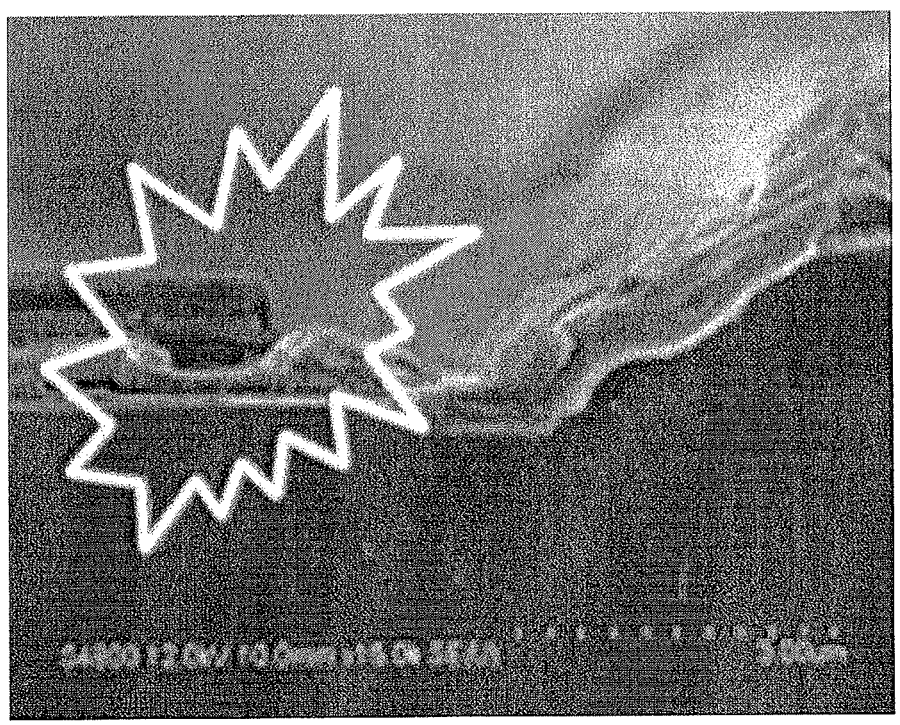
FIG. 15 shows a photograph of a part of FIG. 9 taken by an electron microscope.

FIG. 15 shows a photograph of a part of FIG. 9 taken by an electron microscope.

Referring to FIG. 15, in the second region, the data metal layer is not uniformly coated. The data metal layer is disconnected by the recess portion of the second metal layer. The data metal layer is stored at the entrance of the recess portion. The coated photoresist passes through the recess portion. The data metal layer stored at the entrance of the recess portion blocks permeation of the photoresist developer toward the recess portion. The photoresist remains at the recess portion.

Figure 16:
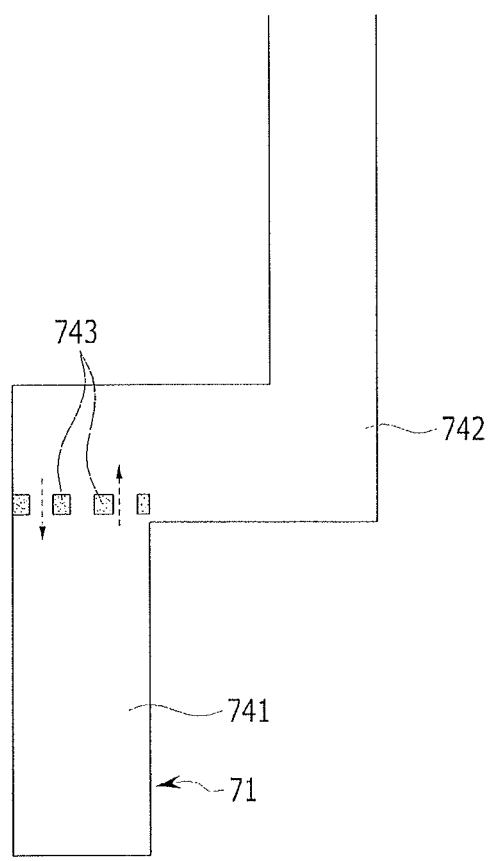
FIG. 16 shows a layout view of a first storage plate in an organic light emitting diode (OLED) display shown in FIG. 12.

FIG. 16 shows a layout view of a first storage plate in an organic light emitting diode (OLED) display shown in FIG. 12.

Referring to FIG. 16, the first storage plate 71 includes a first doping region 741, a plurality of non-doping regions 743 contacting the first doping region 741, and a second doping region 742 connected to the first doping region 741 through gaps between the non-doping regions 743. The plurality of non-doping regions 743 are separately positioned along the width direction of the first storage plate 71, and the second doping region 742 is connected to the first doping region 741 along the length direction of the first storage plate 71.

The second doping region 742 is connected to the first doping region 741 through the gaps between the non-doping regions 743, and signal transmission of the first storage plate 71 is enhanced to increase performance of the capacitor.

Since the first metal layer 731 remains, following the edge of the second storage plate 72 (refer to FIG. 14), the erosion preventing layer 120 is not formed. Therefore, a bar-type non-doping region crossing the first storage plate 71 occurs in the first storage plate 71. In this case, signal transmission is intercepted because the first doping region 741 and the second doping region 742 of the first storage plate 71 are perfectly divided.

Figure 17:
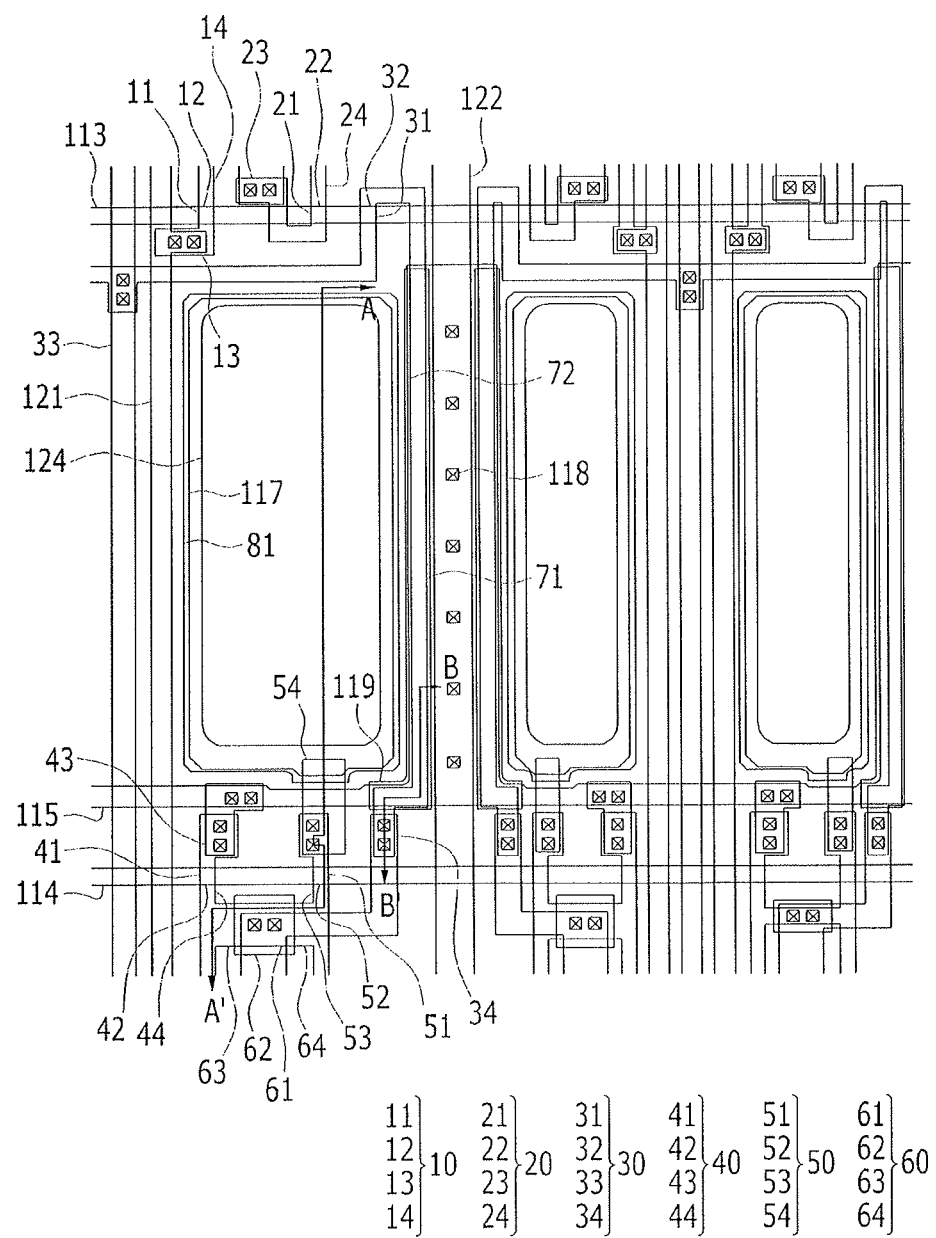
FIG. 17 shows a layout view of a fifth stage of manufacturing an organic light emitting diode (OLED) display according to an exemplary embodiment.
Figure 18:
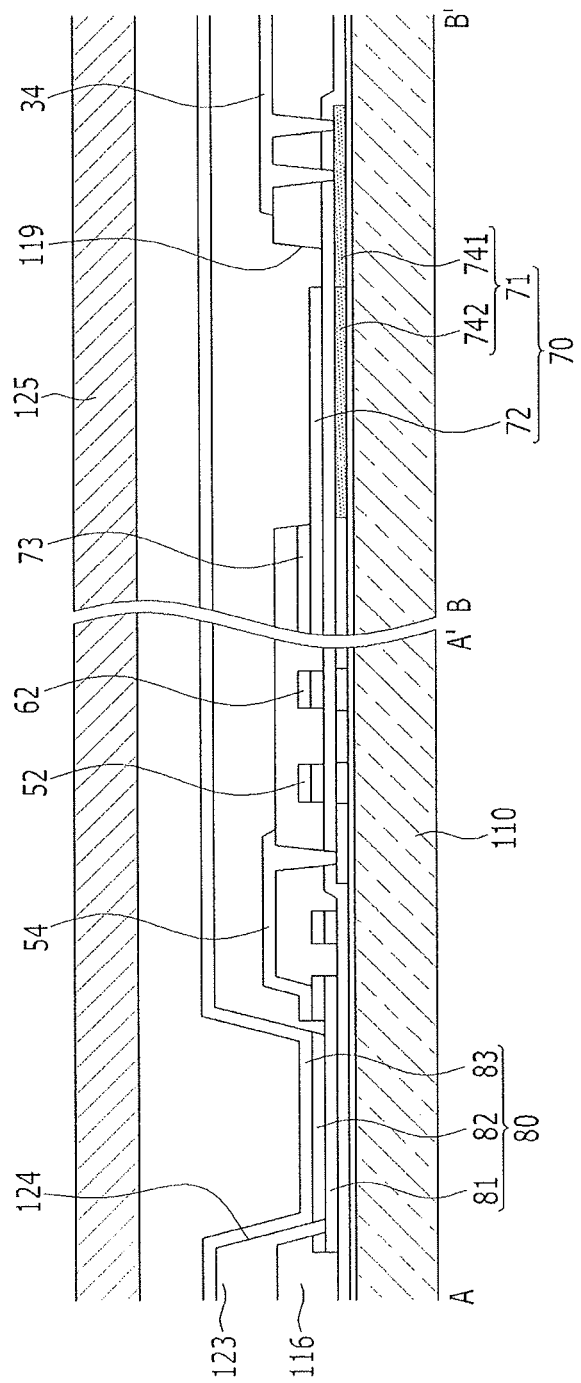
FIG. 18 shows a cross-sectional view with respect to lines A-A' and B-B' of FIG. 17.

FIG. 17 shows a layout view of a fifth stage of manufacturing an organic light emitting diode (OLED) display according to an exemplary embodiment. FIG. 18 shows a cross-sectional view with respect to lines A-A' and B-B' of FIG. 17.

Referring to FIGS. 17-18, a pixel defining layer 123 is formed over the substrate 110 to cover the members formed in the previous stage. The pixel defining layer 123 is patterned through the photolithography process by using a fifth pattern mask, thereby forming a pixel defining layer opening 124 for exposing part of the pixel electrode 81. An organic emission layer 82 is formed on the pixel electrode 81 exposed through the pixel defining layer opening 124, and a common electrode 83 is formed on the organic emission layer 82 to complete an organic light emitting element 80. The common electrode 83 is formed in the pixel defining layer 123 so it is formed over a plurality of pixels.

The organic emission layer 82 is formed with multilayers, including the hole injection layer (HIL), the hole transport layer (HTL), the emission layer, the electron transport layer (ETL), and the electron injection layer (EIL). When the pixel electrode 81 is a hole injection electrode, the hole injection layer (HIL), the hole transport layer (HTL), the emission layer, the electron transport layer (ETL), and the electron injection layer (EIL) are sequentially positioned on the pixel electrode 81. The layers configuring the organic emission layer 82, other than the emission layer, can be omitted if needed. The layers, other than the emission layer, can be formed on the pixel defining layer 123.

A sealing member 125 for protecting the organic light emitting element 80 is disposed on the common electrode 83. The sealing member 125 is adhered to the substrate 110 by an adhesive layer (not shown). The sealing member 125 can be made of various materials, i.e. glass, quartz, ceramic, plastic, or metal. The thin film encapsulation layer can be formed by depositing the inorganic layer and the organic layer on the common electrode 83 without using the adhesive layer.

The completed organic light emitting diode (OLED) display 100 includes first to fifth switching thin film transistors 10, 20, 30, 40, and 50, and a drive thin film transistor 60. However, the number and disposal form of the thin film transistors are not restricted thereto. The number and disposal form of the thin film transistors are variable in many ways.

The first switching thin film transistor 10 includes a first switching semiconductor layer 11, a first switching gate electrode 12, a first switching source electrode 13, and a first switching drain electrode 14. The first switching drain electrode 14 corresponds to a drain region of the first switching semiconductor layer 11.

The second switching thin film transistor 20 includes a second switching semiconductor layer 21, a second switching gate electrode 22, a second switching source electrode 23, and a second switching drain electrode 24. The second switching drain electrode 24 corresponds to a drain region the second switching semiconductor layer 21.

The third switching thin film transistor 30 includes a third switching semiconductor layer 31, a third switching gate electrode 32, a third switching source electrode 33, and a third switching drain electrode 34.

The fourth switching thin film transistor 40 includes a fourth switching semiconductor layer 41, a fourth switching gate electrode 42, a fourth switching source electrode 43, and a fourth switching drain electrode 44. The fourth switching drain electrode 44 corresponds to a drain region of the fourth switching semiconductor layer 41.

The fifth switching thin film transistor 50 includes a fifth switching semiconductor layer 51, a fifth switching gate electrode 52, a fifth switching source electrode 53, and a fifth switching drain electrode 54.

The drive thin film transistor 60 includes a drive semiconductor layer 61, a drive gate electrode 62, a drive source electrode 63, and a drive drain electrode 64. The drive semiconductor layer 61 connects the fourth switching semiconductor layer 41 and the fifth switching semiconductor layer 51. The drive source electrode 63 corresponds to a source region of the drive semiconductor layer 61, and the drive drain electrode 64 corresponds to a drain region of the drive semiconductor layer 61. The drive source electrode 63 is connected to the fourth switching drain electrode 44, and the drive drain electrode 64 is connected to the fifth switching drain electrode 54.

The first storage plate 71 is connected to the drive gate electrode 62, and the second storage plate 72 is connected to the common voltage line 122.

The first switching thin film transistor 10 is used as a switch for selecting a pixel to emit light. The first switching gate electrode 12 is connected to the gate line 113, and the first switching source electrode 13 is connected to the data line 121. The first switching drain electrode 14 is connected to the drive thin film transistor 60 and the fourth switching thin film transistor 40.

The drive thin film transistor 60 receives a driving voltage for emitting the organic emission layer 82 of the selected pixel from the common voltage line 122 and the fourth switching thin film transistor 40, and applies the same to the pixel electrode 81. The fifth switching thin film transistor 50 is disposed between the drive drain electrode 64 and the pixel electrode 81. Thus, deterioration of the organic light emitting element 80 can be compensated.

In the conventional process, an impurity is injected in the first storage plate during its manufacturing process. However, the entire first storage plate is not uniformly doped. In particular, the first storage plate has a part that is not doped; i.e., a non-doping region, due to components formed on the first storage plate and patterning methods. The non-doping region deteriorates the function of the capacitor because it intercepts input signals and output signals of the first storage plate.

By way of summation and review, according to embodiments described above, the organic light emitting diode (OLED) display 100 uses the five pattern masks to simplify the configuration and the corresponding manufacturing method. Also, in the process for patterning the interlayer insulating layer 116 using the third pattern mask, a plurality of erosion preventing layers 120 are formed on the capacitor intermediate 73 to prevent the doping region of the first storage plate 71 from being separated by the non-doping region. Thus, the performance of a capacitor 70 may be increased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. A method for manufacturing an organic light emitting diode display, the method comprising:
    forming a first storage plate of a polysilicon layer;
    forming a gate insulating layer covering the first storage plate on a substrate;
    sequentially forming a second storage plate for covering the first storage plate and a capacitor intermediate on the gate insulating layer;
    forming a first doping region by injecting an impurity to a part that is not covered by the capacitor intermediate in the first storage plate;
    forming an interlayer insulating layer having a capacitor opening exposing the capacitor intermediate, the interlayer insulating layer having a plurality of erosion preventing layers on an edge of the capacitor intermediate toward the first doping region in the capacitor opening;
    removing the capacitor intermediate, including the erosion preventing layer and a lower region of the erosion preventing layer; and
    injecting an impurity in the first storage plate through the second storage plate to form a second doping region contacting the first doping region.

2. The method as claimed in claim 1, wherein:
    the first storage plate is formed in a line pattern, and
    the second storage plate and the capacitor intermediate are positioned in a region other than an end of the first storage plate.

3. The method as claimed in claim 2, wherein:
    the first doping region is positioned on the end of the first storage plate, and the second
    doping region extends to the first doping region in the length direction of the first storage plate.

4. The method as claimed in claim 1, wherein:
    the second storage plate is formed to be a transparent conductive layer, and the capacitor
    intermediate is formed with triple layers of the first metal layer/the second metal layer/the first metal layer.

5. The method as claimed in claim 1, further comprising:
    forming the erosion preventing layer; and
    forming and patterning a data metal layer on the substrate, wherein the erosion preventing layer and the capacitor intermediate are simultaneously eliminated when the data metal layer is patterned.

6. The method as claimed in claim 5, wherein:
    the data metal layer is formed with the same material as the capacitor intermediate.

7. The method as claimed in claim 5, wherein:
    the capacitor opening is formed to be wider than the capacitor intermediate, and
    part of the edge of the capacitor intermediate that is not covered with the erosion preventing layer remains when the capacitor intermediate is removed.

8. The method as claimed in claim 7, wherein:
    the second doping region contacts the first doping region through a gap between the capacitor intermediates in the first storage plate.

* * * * *